(12) United States Patent
Nam et al.

(10) Patent No.: US 8,310,019 B2
(45) Date of Patent: Nov. 13, 2012

(54) MAGNETIC MEMORY DEVICE

(75) Inventors: Kyungtae Nam, Suwon-si (KR); Sukhun Choi, Suwon-si (KR); Jangeun Lee, Suwon-si (KR); Sechung Oh, Suwon-si (KR); Junho Jeong, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/361,406

(22) Filed: Jan. 30, 2012

(65) Prior Publication Data

US 2012/0126353 A1  May 24, 2012

Related U.S. Application Data

(62) Division of application No. 12/686,145, filed on Jan. 12, 2010, now Pat. No. 8,129,806.

(30) Foreign Application Priority Data

Jan. 21, 2009 (KR) .................. 10-2009-0005190

(51) Int. Cl.
    *H01L 29/82* (2006.01)

(52) U.S. Cl. ................. 257/421; 257/E21.665

(58) Field of Classification Search .................. None
See application file for complete search history.

(56) References Cited

U.S. PATENT DOCUMENTS

| 7,573,736 B2 * | 8/2009 | Wang et al. ............... 365/158 |
| 7,813,165 B2 * | 10/2010 | Daughton et al. .......... 365/158 |
| 2005/0002228 A1 * | 1/2005 | Dieny et al. ................ 365/171 |
| 2005/0078510 A1 * | 4/2005 | Jeong et al. ................ 365/158 |
| 2005/0157542 A1 * | 7/2005 | Hosomi et al. ............. 365/158 |
| 2006/0062044 A1 * | 3/2006 | Jeong et al. ................ 365/158 |
| 2006/0081952 A1 * | 4/2006 | Lin ............................. 257/421 |
| 2007/0187785 A1 * | 8/2007 | Hung et al. ................ 257/421 |

OTHER PUBLICATIONS

Watakabe et al. Electrical and structural properties of poly-SiGe film formed by pulsed-laser annealing. Jun. 1, 2004. Journal of Applied Physics. vol. 95, No. 11. pp. 6457-6461.*

* cited by examiner

*Primary Examiner* — Hoang-Quan Ho
(74) *Attorney, Agent, or Firm* — F. Chau & Associates, LLC

(57) ABSTRACT

A magnetic memory device includes a magnetic tunnel junction (MTJ) structure and an electrode embedded in a dielectric structure. The MTJ structure includes a free layer. The electrode is formed of silicon-germanium and is electrically connected to the MTJ. The electrode heats the free layer to reduce the coercive force of the free layer to reduce a critical current density.

6 Claims, 12 Drawing Sheets

MAGNETIC MEMORY DEVICE

CROSS-REFERENCE TO RELATED APPLICATIONS

This U.S. non-provisional patent application claims priority from, and is a divisional of, U.S. application Ser. No. 12/686,145, filed on Jan. 12, 2010 now U.S. Pat. No. 8,129,806, which in turn claims priority under 35 U.S.C. §119 from Korean Patent Application No. 10-2009-0005190, filed on Jan. 21, 2009, the entire contents of which are herein incorporated by reference in their entirety.

BACKGROUND

The present disclosure is directed to semiconductor memory devices, and more particularly, to magnetic memory devices.

In general, a magnetic random access memory (MRAM), which is a nonvolatile memory device, stores data by using a magnetoresistance effect in which the resistance of an electrical conductor varies according to a peripheral magnetic field. The MRAM may include a plurality of MRAM cells including a magnetic tunnel junction (MTJ).

An MTJ may be configured to include a sandwich-type multi-layer thin film in which electrons can tunnel through a very thin dielectric layer disposed between two ferromagnetic thin layers when an external electrical signal is applied thereto. One of the two ferromagnetic thin layers is called a free layer, and the other is called a pinned layer.

When the magnetization directions in the free layer and the pinned layer are arranged in parallel to each other, a tunneling current flowing through the MTJ becomes maximized. That is, a tunneling resistance is minimized. On the other hand, when the magnetization directions in the free layer and the pinned layer are arranged in anti-parallel to each other, a tunneling current flowing through the MTJ becomes minimized. That is, a tunneling resistance is maximized.

A typical memory uses an electric charge to store data, whereas the MRAM uses a magnetic charge to store data. That is, digital data are represented by differing polarities of the ferromagnetic layers, in which a '0' is represented by a low-resistance state where the magnetization directions of the two magnetic layers are parallel to each other and a '1' is represented by a high-resistance state where the magnetization directions of the two magnetic layers are anti-parallel to each other. Data may be written to memory cells by passing a current through a pair of perpendicular wires above and below the cell, which creates an induced magnetic field at the junction, which is picked up by the free, writable layer. However, as a cell is scaled down in size, the induced field will overlap adjacent cells over a small area, leading to potential false writes, a phenomenon known as write disturbance.

Recently, MRAM devices suitable for a spin injection mechanism have been proposed to overcome write disturbance and low integration density.

However, a write current density must be higher than a critical current density to switch a selected MRAM cell by using the spin injection mechanism. This increases the power consumption of an MRAM, which otherwise would restrict the increased integration density of the MRAMs.

SUMMARY

Embodiments of the inventive concept provide magnetic memory devices with a reduced write current.

Embodiments of the inventive concept provide magnetic memory devices including: a MTJ structure including a free layer on a semiconductor substrate; and an electrode formed of silicon-germanium on the semiconductor substrate, wherein the electrode heats the free layer to reduce the coercive force of the free layer for data storage.

In some embodiments, the germanium content of the silicon-germanium may be about 10% to about 57%. The silicon-germanium may have a polycrystalline structure.

In other embodiments, the electrode may be an top electrode disposed on the MTJ structure.

In further embodiments, the top electrode may contact the free layer directly.

In still further embodiments, the MTJ structure may further include a pin layer disposed on the semiconductor substrate and a tunnel insulating layer disposed between the pin layer and the free layer, wherein the top electrode may have the same horizontal area as the free layer and have a smaller horizontal area than the pin layer and the tunnel insulating layer.

In still further embodiments, the magnetic memory devices may further include a capping layer disposed between the electrode and the free layer and having conductivity.

In still further embodiments, the magnetic memory devices may further include a transistor supplying a current for switching the magnetization direction of the free layer.

In still further embodiments, wherein the electrode may be a bottom electrode disposed between the semiconductor substrate and the MTJ structure.

In still further embodiments, the bottom electrode may have a smaller horizontal area than the free layer.

DETAILED DESCRIPTION OF EXEMPLARY EMBODIMENTS

Figure 1:
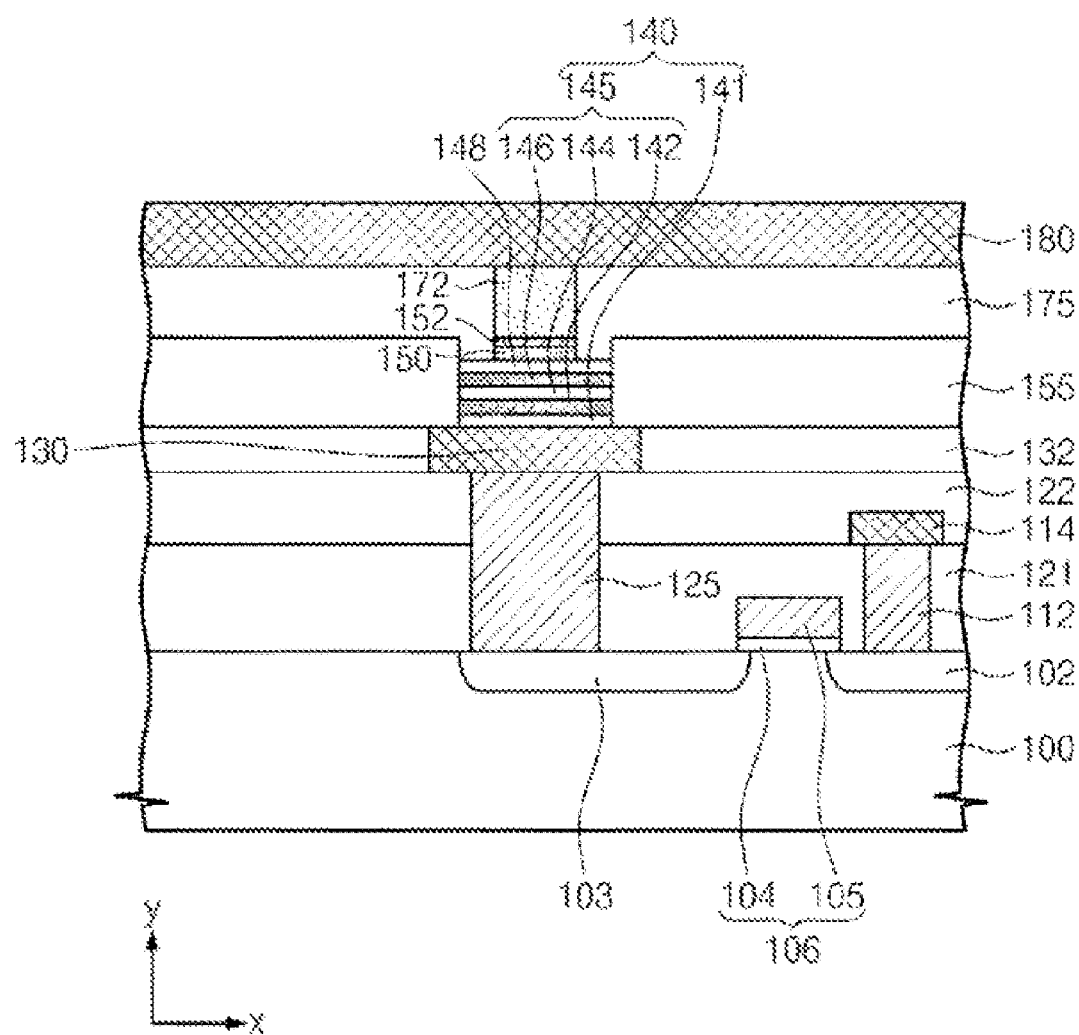
FIG. 1 is a sectional view of a magnetic memory device according to an exemplary embodiment of the invention.

Exemplary embodiments of the invention will be described below in more detail with reference to the accompanying drawings. Embodiments of the invention concept may, however, be embodied in different forms and should not be construed as limited to the embodiments set forth herein. In the drawings, like reference numerals refer to like elements throughout.

FIG. 1 is a sectional view of a magnetic memory device according to an exemplary embodiment of the invention.

Referring to FIG. 1, a gate pattern 106 is disposed on a semiconductor substrate 100. The gate pattern 106 may include a gate insulating layer 104 on the semiconductor substrate 100 and a gate electrode 105 on the gate insulating layer 104. A source electrode 102 and a drain electrode 103 are disposed in the semiconductor substrate 100 adjacent to the gate pattern 106. The source electrode 102, the drain electrode 103, and the gate pattern 106 constitute a transistor. The transistor may serve as a switching unit of the magnetic memory device. A spin transfer torque (STT) magnetic memory device may use a transistor as a switching unit because it can supply a current to a magnetic tunnel junction (MTJ) structure in both directions.

A first dielectric interlayer 121 is disposed to cover the gate pattern 106. A metal contact 112 connected to the source electrode 102 may be disposed in the first dielectric interlayer 121. A metal interconnection 114 connected to the metal contact 112 may be disposed on the first dielectric interlayer 121. A second dielectric interlayer 122 is disposed to cover the metal interconnection 114. A bottom electrode contact 125 connected electrically to the drain electrode 103 is disposed in the first and second dielectric interlayers 121 and 122. A third dielectric interlayer 132 is disposed over the second dielectric interlayer 122. A bottom electrode 130 connected electrically to the bottom electrode contact 125 is disposed in the third dielectric interlayer 132.

A fourth dielectric interlayer 155 is disposed on the third dielectric interlayer 132. An MTJ structure connected electrically to the bottom electrode 130 is disposed in the fourth dielectric interlayer 155. The MTJ structure may include a pin layer 140 on the bottom electrode 130, a tunnel insulating layer 148 on the pin layer 140, and a free layer 150 on the tunnel insulating layer 148. The pin layer 140 may include a pinning layer 141 and a pinned layer 145. For example, the pinning layer 141 may be a platinum-manganese (PtMn) layer.

The magnetization direction of the pinned layer 145 is fixed by the pinning layer 141. The pinned layer 145 may be a synthetic anti-ferromagnetic layer including a lower ferromagnetic layer 142, an anti-ferromagnetic coupling spacer 144, and an upper ferromagnetic layer 146. The lower ferromagnetic layer 142 may include cobalt-iron (CoFe), and the upper ferromagnetic layer 146 may include cobalt-iron-boron (CoFeB).

The tunnel insulating layer 148 may include magnesium oxide (MgO). The free layer 150 may include cobalt-iron-boron (CoFeB). The magnetization direction of the free layer 150 may be switched by a switching current supplied through the transistor.

A conductive capping layer 152 may be disposed on the free layer 150. The capping layer 152 may serve to protect the free layer 150 and facilitate a spin transfer that will be described below. A fifth dielectric interlayer 175 is disposed on the fourth dielectric interlayer 155. A top electrode 172 is disposed in the fifth dielectric interlayer 175. That is, the top electrode 172 is disposed to penetrate the fifth dielectric interlayer 175. The top electrode 172 may be formed of silicon-germanium (Si—Ge) The upper layer 175 may contact the free layer 150 directly without the capping layer 152 interposed therebetween. A bit line 180 connected electrically to the top electrode 172 is disposed on the fifth dielectric interlayer 175.

According an exemplary embodiment of the invention, the top electrode 172 is formed of silicon-germanium (Si—Ge). The resistance of the silicon-germanium (Si—Ge) may be controlled according to the concentration of Ge. The germanium content of the silicon-germanium (Si—Ge) may be from about 10% to about 57%, and may be about 10% to about 20%. For data storage, the top electrode 172 heats the free layer 150 to reduce the coercive force of the free layer 150. The silicon-germanium may have a conductive polycrystalline structure. Dopants may be implanted into the silicon-germanium to increase the conductivity of the silicon-germanium.

The top electrode 172 may have the same horizontal area as the free layer 150 and have a smaller horizontal area than the tunnel insulating layer 148 and the pin layer 140. When the top electrode 172 has a smaller horizontal area than the tunnel insulating layer 148 and the pin layer 140, the resistance of the top electrode 172 increases, thus making it possible to heat the free layer 150 sufficiently to reduce its coercive force. When the top electrode 172 has the same horizontal area as the free layer 150, the heat generated at the interface between the top electrode 172 and the free layer 150 can easily heat the entire free layer 150. Accordingly, it is possible to increase the heating efficiency of a selected cell in a spin transfer torque magnetic random access memory (STT-MRAM) (i.e., a magnetic memory device using a spin injection mechanism).

Hereinafter, a description will be given of a data storage method for a magnetic memory device according to an exemplary embodiment of the invention.

Referring back to FIG. 1, a word line signal is applied to the gate electrode 105 of the transistor, and a bit line write signal is simultaneously applied to the bit line 180. The word line signal may be a voltage pulse signal that has a word line voltage higher than the threshold voltage of the transistor for a predetermined time. Thus, the transistor connected to the word line is turned on during the application of the word line voltage. Also, the bit line write signal may be a current pulse signal that applies a current to the bit line 180 during the application of the word line signal. Accordingly, a write current flows through the MTJ structure and the transistor connected in series thereto.

The write current may be a positive write current (+Iw) flowing from the free layer 150 to the pin layer 140, or a negative write current (−Iw) flowing from the pin layer 140 to the free layer 150. In an exemplary embodiment of the invention, in the MTJ structure, the positive write current flows in a negative Y-axis direction and the negative write current flows in a positive Y-axis direction, as illustrated in FIG. 1. In other words, electrons flow in the positive Y-axis direction during the flow of the positive write current, and electrons flow in the negative Y-axis direction during the flow of the negative write current.

When the metal interconnection 114 is grounded in a program (or write) operation, the positive write current may be generated by applying a positive program voltage to the bit line 180. Likewise, when the metal interconnection 114 is grounded in a program (or write) operation, the negative write current may be generated by applying a negative program voltage to the bit line 180.

When the positive write current flows through the MTJ structure, most of the electrons passing the pin layer 140 have a spin exhibiting the same magnetization direction as the fixed magnetic polarizations in the pin layer 140. For example, when the majority magnetic polarizations in the pin layer 140 have an up-spin, most of the electrons passing the pin layer 140 have an up-spin. In particular, when the pin layer 140 is a synthetic anti-ferromagnetic layer as described above, most of the electrons have a spin exhibiting the same magnetization direction as the upper ferromagnetic layer 146 of the synthetic anti-ferromagnetic layer.

The up-spin electrons pass the tunnel insulating layer 148 and reach the free layer 150. The number of the up-spin electrons reaching the free layer 150 is proportional to the current density of the positive write current. Thus, when the current density of the positive write current increases, the free layer 150 may have most magnetic polarizations parallel to the fixed magnetic polarizations in the pin layer 140, regardless of the initial magnetization direction. This is caused by the up-spin electrons being injected into the free layer 150. Consequently, when the current density of the positive write current is higher than a critical current density, the MTJ structure may be switched to have the minimum resistance value. When the positive write current is supplied, the top electrode 172 heats the free layer 150 to reduce the coercive force of the free layer 150, thus reducing the critical current density. Accordingly, the positive write current is reduced, the power consumption of the magnetic memory device can be minimized, and the transistor can be scaled down in size.

On the other hand, when the negative write current flows through the MTJ structure, electrons are injected into the free layer 150 from the top electrode 172.

The electrons include up-spin electrons and down-spin electrons. When most of the fixed magnetic polarizations in the pin layer 140 have an up-spin, only the up-spin electrons injected into the free layer 150 pass the tunnel insulating layer 148 and reach the pin layer 140 and the down-spin electrons injected into the free layer 150 are accumulated in the free layer 150. The number of the up-spin electrons and the down-spin electrons injected into the free layer 150 is proportional to the current density of the negative write current. Thus, when the current density of the negative write current increases, the free layer 150 may have majority magnetic polarizations anti-parallel to the magnetization direction of the pin layer 140, due to the down-spin electrons accumulated in the free layer 150, regardless of the initial magnetization direction. Consequently, when the current density of the negative write current is higher than a critical current density, the MTJ structure may be switched to have the maximum resistance value. When the negative write current is supplied, the top electrode 172 heats the free layer 150 to reduce the coercive force of the free layer 150. Accordingly, the critical current density is reduced and the power consumption of a magnetic memory device according to an embodiment of the invention can be minimized.

Figure 2:
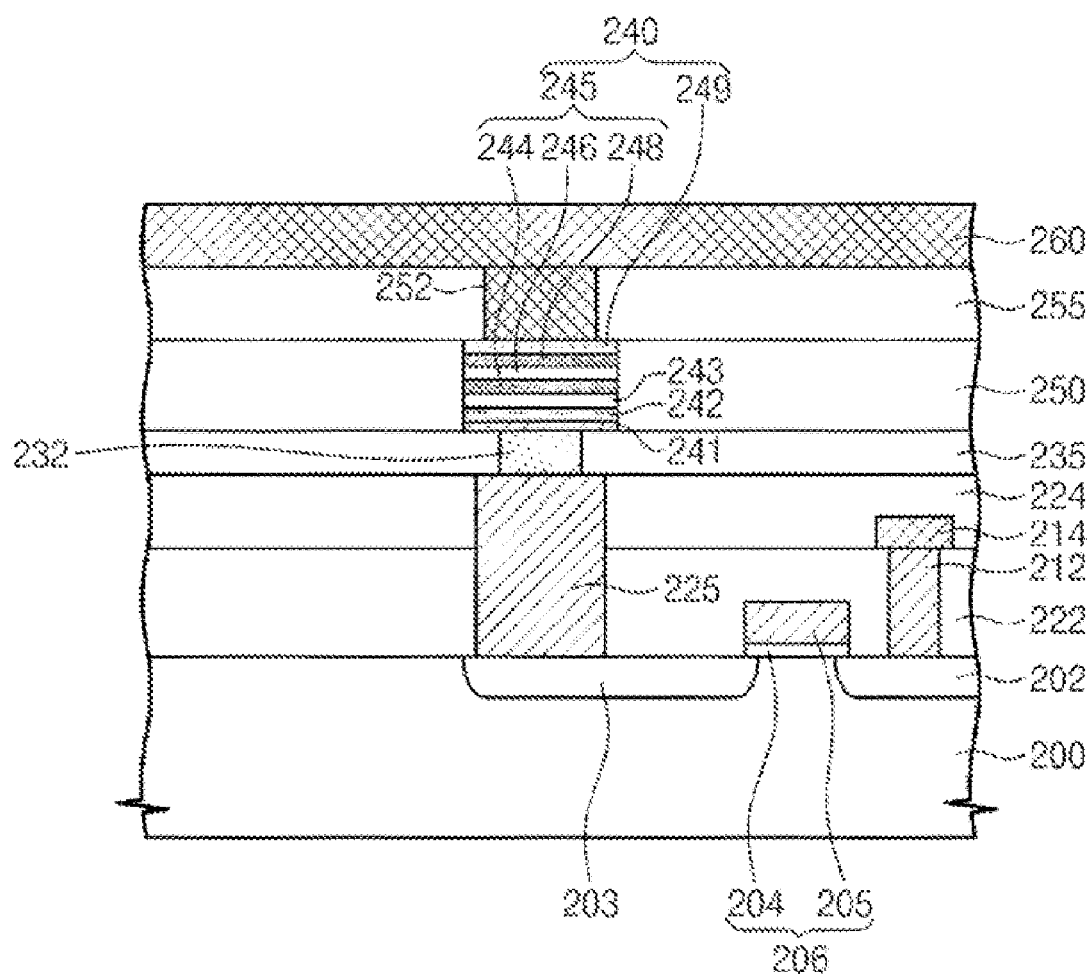
FIG. 2 is a sectional view of a magnetic memory device according to another exemplary embodiment of the invention.

FIG. 2 is a sectional view of a magnetic memory device according to another exemplary embodiment of the invention.

Referring to FIG. 2, a gate pattern 206 is disposed on a semiconductor substrate 200. The gate pattern 206 may include a gate insulating layer 204 on the semiconductor substrate 200 and a gate electrode 205 on the gate insulating layer 204. A source electrode 202 and a drain electrode 203 are disposed in the semiconductor substrate 200 adjacent to the gate pattern 206. The source electrode 202, the drain electrode 203, and the gate pattern 206 constitute a transistor. The transistor may serve as a switching unit of the magnetic memory device. A spin transfer torque (STT) magnetic memory device may use a transistor as a switching unit because it can supply a current to a magnetic tunnel junction (MTJ) structure in both directions.

A first dielectric interlayer 222 is disposed to cover the gate pattern 206. A metal contact 212 connected to the source electrode 202 may be disposed in the first dielectric interlayer 222. A metal interconnection 214 connected to the metal contact 212 may be disposed on the first dielectric interlayer 222. A second dielectric interlayer 224 is disposed to cover the metal interconnection 214. A bottom electrode contact 225 connected electrically to the drain electrode 203 is disposed in the first and second dielectric interlayers 222 and 224. A third dielectric interlayer 235 is disposed on the second dielectric interlayer 224.

A bottom electrode 232 connected electrically to the bottom electrode contact 225 is disposed in the third dielectric interlayer 235. That is, the bottom electrode 232 is disposed to penetrate the third dielectric interlayer 235. The bottom electrode 232 is formed of silicon-germanium (Si—Ge). The resistance of the bottom electrode 232 may be controlled according to the concentration of Ge. The germanium content of the silicon-germanium (Si—Ge) may be about 10% to about 57%, and may be about 10% to about 20%. For data storage, the bottom electrode 232 heats a free layer 242, which will be described below, to reduce the coercive force of the free layer 242. The silicon-germanium may have a conductive polycrystalline structure.

A fourth dielectric interlayer 250 is disposed on the third dielectric interlayer 235. A MTJ structure connected electrically to the bottom electrode 232 is disposed in the fourth dielectric interlayer 250. The MTJ structure may include a free layer 242 on the bottom electrode 232, a tunnel insulating layer 243 on the free layer 242, and a pin layer 240 on the tunnel insulating layer 243. The pin layer 240 may include a pinned layer 245 and a pinning layer 249 on the pinned layer 245. For example, the pinning layer 249 may be a platinum-manganese (PtMn) layer.

The magnetization direction of the pinned layer 245 is fixed by the pinning layer 249. The pinning layer 249 may be a synthetic anti-ferromagnetic layer including a lower ferromagnetic layer 244, an anti-ferromagnetic coupling spacer 246, and an upper ferromagnetic layer 248. The lower ferromagnetic layer 244 may include cobalt-iron-boron (CoFeB), and the upper ferromagnetic layer 248 may include cobalt-iron (CoFe).

The tunnel insulating layer 243 may include magnesium oxide (MgO). The free layer 242 may include cobalt-iron-boron (CoFeB). The magnetization direction of the free layer 242 may be switched by a switching current supplied through the transistor.

A conductive capping layer 241 may be disposed between the free layer 242 and the bottom electrode 232. The capping layer 241 may serve to facilitate a spin transfer. A fifth dielectric interlayer 255 is disposed on the fourth dielectric interlayer 250. A top electrode 252 connected to the MTJ structure is disposed in the fifth dielectric interlayer 255. A bit line 260 connected electrically to the top electrode 252 is disposed on the fifth dielectric interlayer 255.

The bottom electrode 232 may have a smaller horizontal area than the free layer 242. The resistance of the bottom electrode 232 can be increased by reducing the horizontal area of the bottom electrode 232. Accordingly, the heat generated by the bottom electrode 232 heats the free layer 242 to reduce the coercive force of the free layer 242, thereby reducing a critical current density necessary to switch the free layer 242. A magnetic memory device according to the exemplary embodiment of FIG. 2 can operate in the same way as a magnetic memory device according to the exemplary embodiment of FIG. 1.

FIGS. 3A to 3E are sectional views illustrating a method for fabricating a magnetic memory device according to an exemplary embodiment of the invention.

Figure 3A:
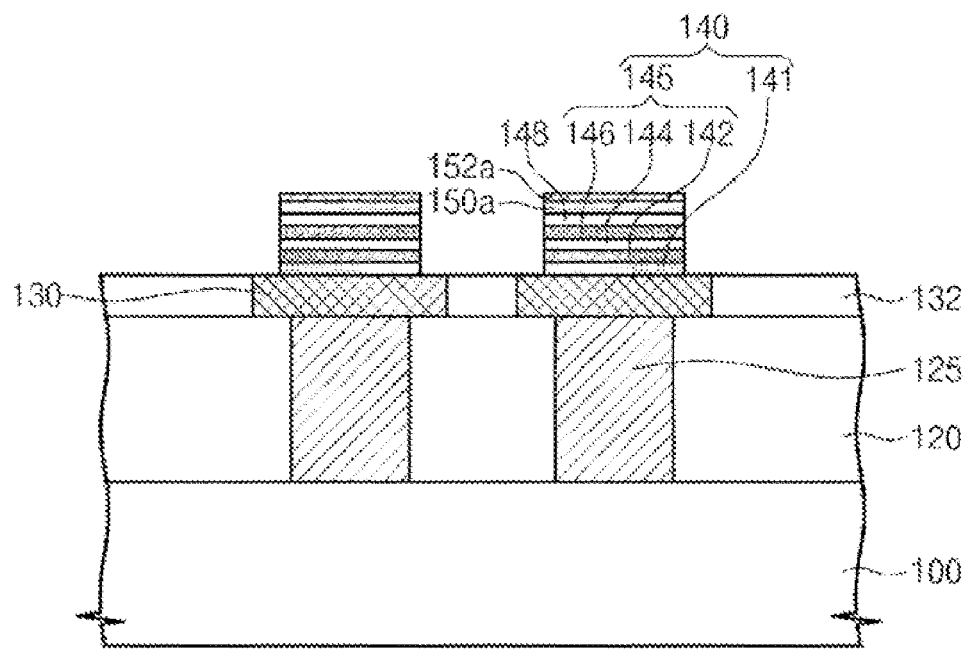
FIGS. 3A to 3E are sectional views illustrating a method for fabricating a magnetic memory device according to an exemplary embodiment of the invention.

Referring to FIG. 3A, a first dielectric interlayer 120 is formed on a semiconductor substrate 100. The first dielectric interlayer 120 may include the dielectric interlayers 121 and 122 illustrated in FIG. 1. The semiconductor substrate 100 may include a switching unit (e.g., a transistor). A bottom electrode contact 125 connected electrically to the switching unit is formed in the first dielectric interlayer 120. A second dielectric interlayer 132 is formed on the bottom electrode contact 125. A bottom electrode 130 connected electrically to the bottom electrode contact 125 is formed in the second dielectric interlayer 132.

A pin layer 140 connected electrically to the bottom electrode 130, a tunnel insulating layer 148, and a preliminary free layer 150a are sequentially stacked on the second dielectric interlayer 132. The pin layer 140 may include a pinning layer 141 and a pinned layer 145. For example, the pinning layer 141 may be formed of platinum-manganese (PtMn).

The pinned layer 145 may be a synthetic anti-ferromagnetic layer including a lower ferromagnetic layer 142, an anti-ferromagnetic coupling spacer 144, and an upper ferromagnetic layer 146. The lower ferromagnetic layer 142 may be formed of cobalt-iron (CoFe), and the upper ferromagnetic layer 146 may be formed of cobalt-iron-boron (CoFeB). The tunnel insulating layer 148 may be formed of magnesium oxide (MgO). The preliminary free layer 150a may be formed of cobalt-iron-boron (CoFeB). A preliminary conductive capping layer 152a may be formed on the preliminary free layer 150a. The preliminary capping layer 152a may be formed of tantalum.

Figure 3B:
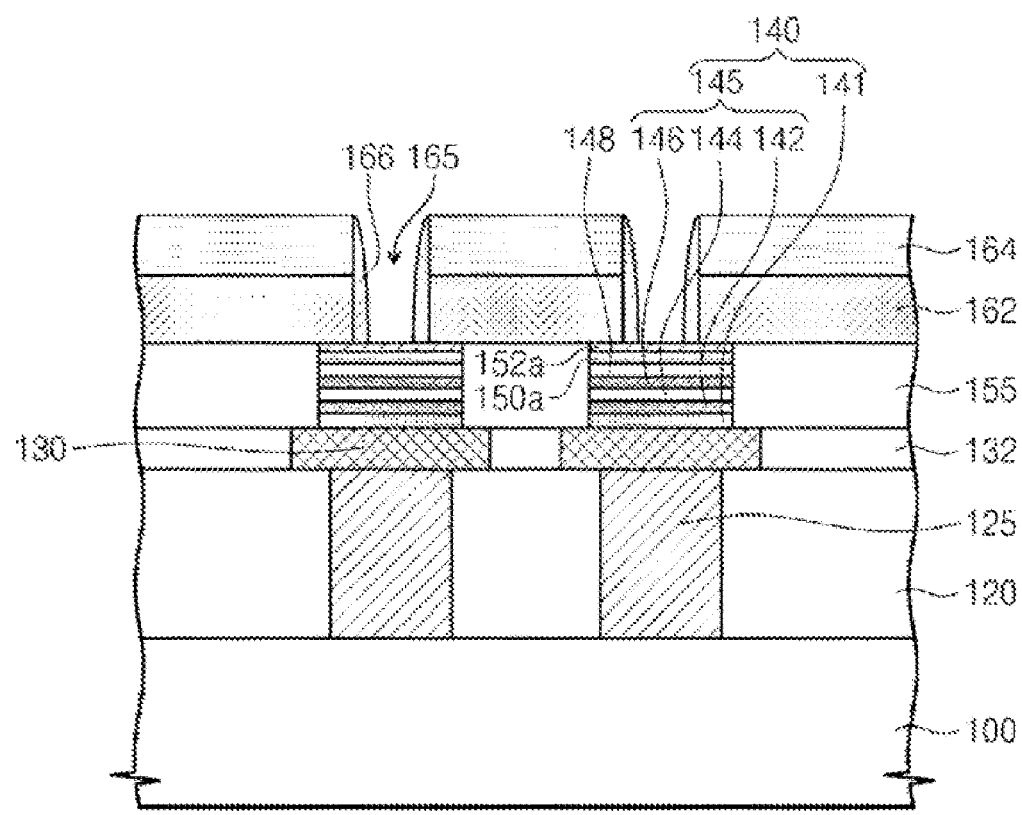

Referring to FIG. 3B, a third dielectric interlayer 155 is formed to cover the pin layer 140, the tunnel insulating layer 148, the preliminary free layer 150a and the preliminary capping layer 152a and expose the top surface of the preliminary capping layer 152a. A first sacrificial layer 162 is formed to cover the preliminary capping layer 152a. The first sacrificial layer 162 may be formed of silicon oxynitride (SiON). A second sacrificial layer 164 is formed on the first sacrificial layer 162. The second sacrificial layer 164 may be formed of a plasma enhanced oxide (PEOX) layer. A contact hole 165 is formed in the first and second sacrificial layers 162 and 164 to expose the preliminary capping layer 152a. A spacer 166 is formed at the sidewalls of the contact hole 165. The spacer 166 may be formed of silicon nitride. During the forming of the contact hole 165 and the spacer 166, the preliminary capping layer 152a can substantially prevent etching damage to the preliminary free layer 150a.

Figure 3C:
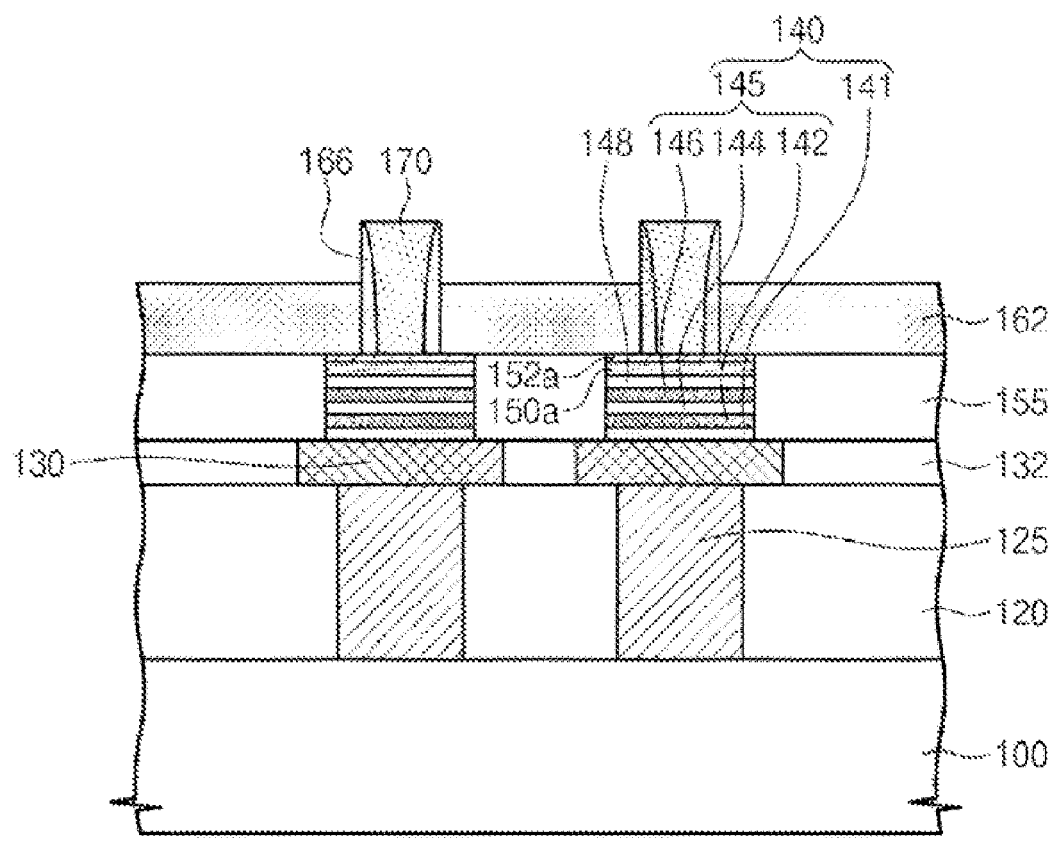

Referring to FIG. 3C, a preliminary top electrode 170 is formed to fill the contact hole 165. The preliminary top electrode 170 may be formed of silicon-germanium (Si—Ge). The silicon-germanium (Si—Ge) has a good gap-fill capability, and can thus fill the contact hole 165 without generating a seam therein. The forming of the preliminary top electrode 170 may include forming a silicon-germanium layer covering the second sacrificial layer 164 and filling the contact hole 165, and planarizing the silicon-germanium layer to expose the second sacrificial layer 164. The silicon-germanium layer and the PEOX layer 164 have good etch selectivity, thus facilitating detecting an endpoint of a planarization process (e.g., a chemical mechanical polishing (CMP) process). After the preliminary top electrode 170 is formed, the second sacrificial layer 164 is removed. The second sacrificial layer 164 may be removed through a wet etch process. The preliminary top electrode 170 has a good etch selectivity with respect to the second sacrificial layer 164 because it is formed of silicon-germanium. The preliminary top electrode 170 may be protruded by removing the second sacrificial layer 164.

Figure 3D:
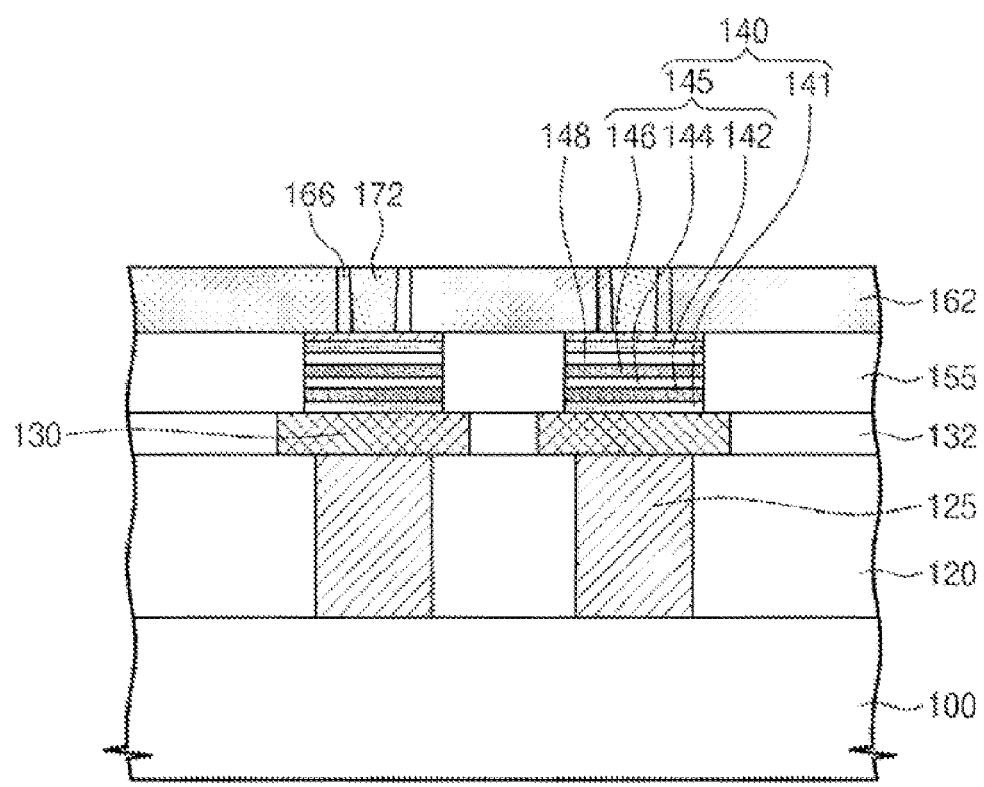

Referring to FIG. 3D, the protruded preliminary top electrode 170 is planarized to form a top electrode 172. The top electrode 172 is formed through two planarization processes, thereby making it possible to improve the uniformity of the top electrode 172. That is, it is possible to minimize dishing by erosion that may be generated in a planarization process (e.g., a CMP process). In the planarization process for the top electrode 172, the first sacrificial layer 162 can serve as an etch stopper because it has a good etch selectivity with respect to the top electrode 172.

Figure 3E:
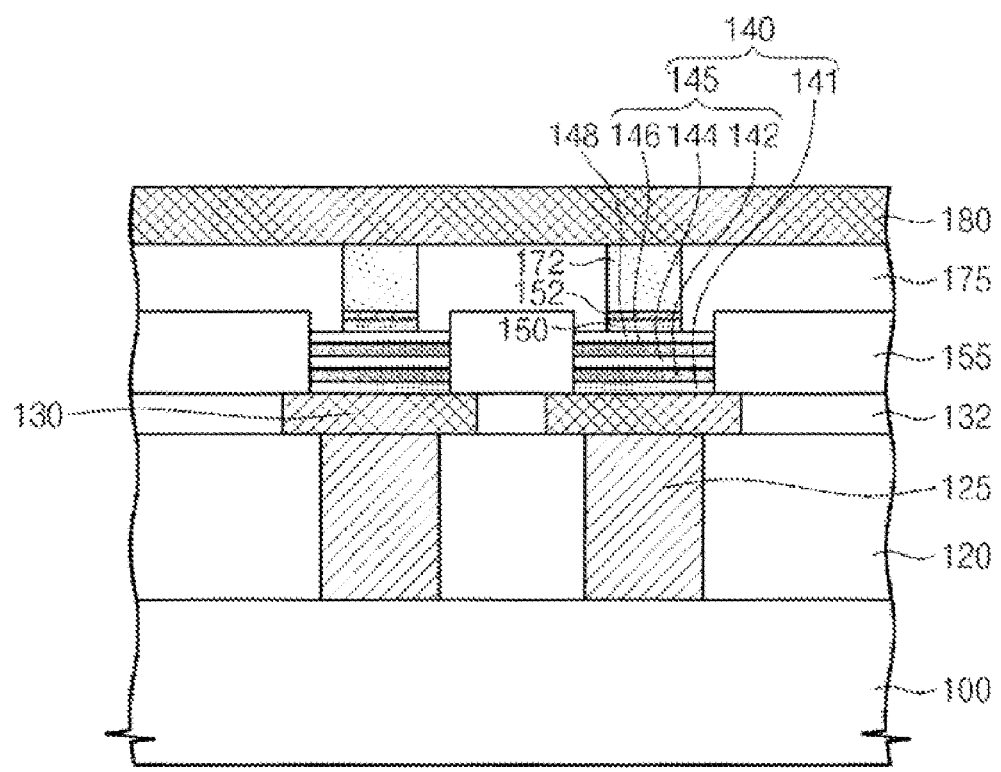

Referring to FIG. 3E, the first sacrificial layer 162 and the spacer 166 are removed. The first sacrificial layer 162 and the spacer 166 can minimize the etching of the top electrode 172 because they have a good etch selectivity with respect to the top electrode 172. Using the top electrode 172 as an etch mask, the preliminary capping layer 152a and the preliminary free layer 150a are etched to a capping layer 152 and a free layer 150. Through the etching process, the horizontal area of the free layer 150 may be substantially identical to the horizontal area of the top electrode 172. Accordingly, the heat generated by the top electrode 172 may affect the entire region of the free layer 150.

A fourth dielectric interlayer 175 is formed to cover the third dielectric interlayer 155 and expose the top surface of the top electrode 172. A bit line 180 connected electrically to the top electrode 172 may be formed on the fourth dielectric interlayer 175.

FIGS. 4A to 4E are sectional views illustrating a method for fabricating a magnetic memory device according to another exemplary embodiment of the invention.

Figure 4A:
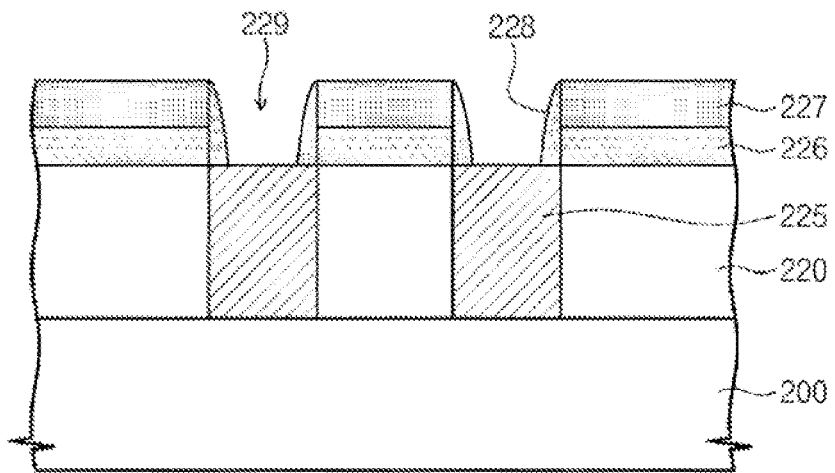
FIGS. 4A to 4E are sectional views illustrating a method for fabricating a magnetic memory device according to another exemplary embodiment of the invention.

Referring to FIG. 4A, a first dielectric interlayer 220 is formed on a semiconductor substrate 200. The semiconductor substrate 200 may include a switching unit (e.g., a transistor) (not shown). A bottom electrode contact 225 connected electrically to the switching unit is formed in the first dielectric interlayer 220. A first sacrificial layer 226 is formed on the first dielectric interlayer 220. The first sacrificial layer 226 may be formed of silicon oxynitride (SiON). A second sacrificial layer 227 is formed on the second sacrificial layer 226. The second sacrificial layer 227 may be formed of a PEOX layer.

A contact hole 229 is formed in the first and second sacrificial layers 226 and 227 to expose the bottom electrode contact 225. A spacer 228 is formed at the sidewalls of the contact hole 228. The spacer 228 may be formed of silicon nitride.

Figure 4B:
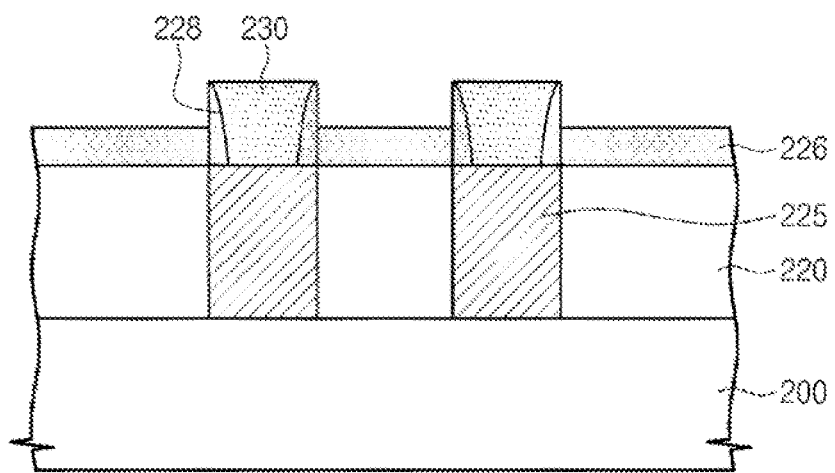

Referring to FIG. 4B, a preliminary bottom electrode 230 is formed to fill the contact hole 229. The preliminary bottom electrode 230 may be formed of silicon-germanium (Si—Ge). The silicon-germanium (Si—Ge) has a good gap-fill capability, and can thus fill the contact hole 229 without generating a seam therein. The forming of the preliminary bottom electrode 230 may include forming a silicon-germanium layer covering the second sacrificial layer 227 and filling the contact hole 229, and planarizing the silicon-germanium layer to expose the second sacrificial layer 227. The silicon-germanium layer and the PEOX layer have a good etch selectivity, thus facilitating the detection of an endpoint of a planarization process (e.g., a chemical mechanical polishing (CMP) process). After the preliminary bottom electrode 230 is formed, the second sacrificial layer 227 is removed. The second sacrificial layer 227 may be removed through a wet etch process. The preliminary bottom electrode 230 has a good etch selectivity with respect to the second sacrificial layer 227 because it is formed of silicon-germanium. The preliminary bottom electrode 230 may be protruded by removing the second sacrificial layer 227.

Figure 4C:
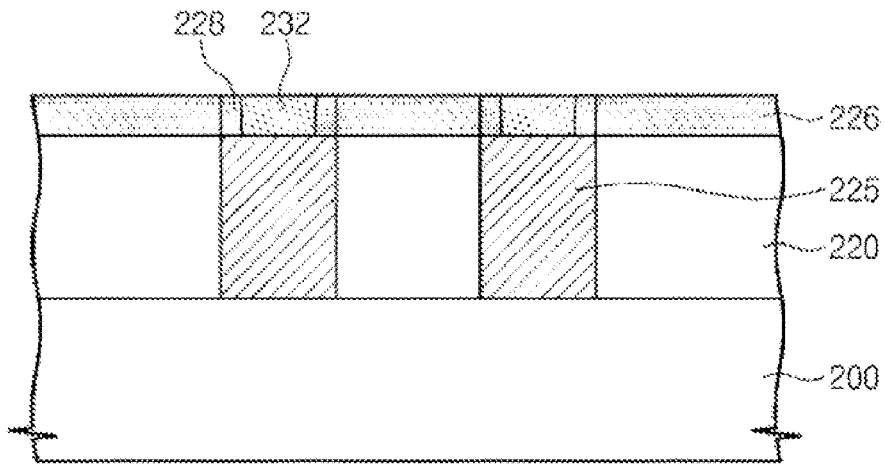

Referring to FIG. 4C, the protruded preliminary bottom electrode 230 is planarized to form a bottom electrode 232. The bottom electrode 232 is formed through two planarization processes, thereby making it possible to improve the uniformity of the bottom electrode 232. That is, it is possible to minimize dishing by erosion that may be generated in a planarization process (e.g., a CMP process). In the planarization process for the bottom electrode 232, the first sacrificial layer 226 can serve as an etch stopper because it has a good etch selectivity with respect to the bottom electrode 232.

Figure 4D:
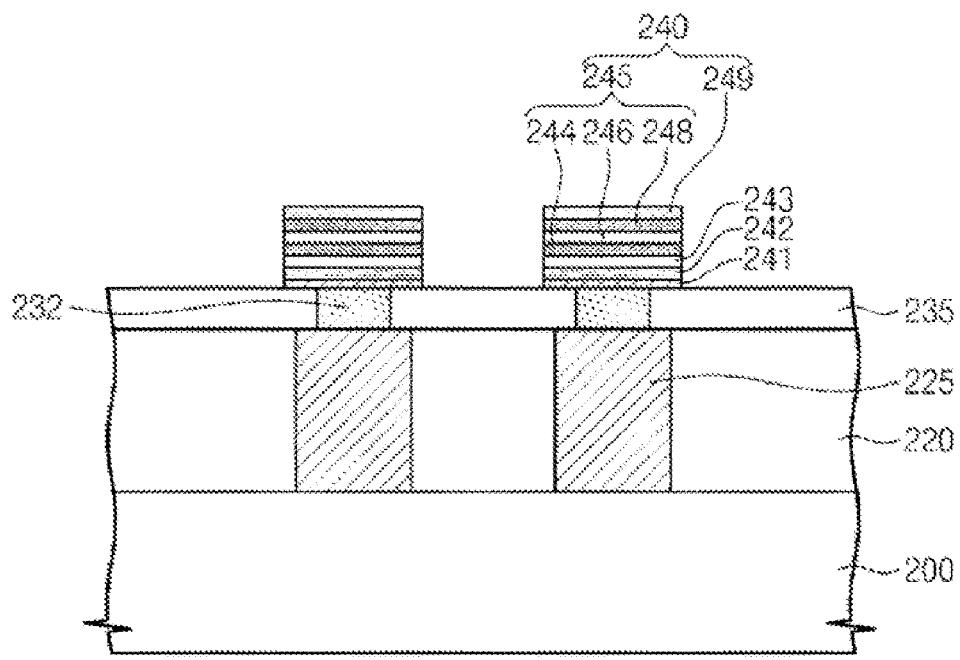

Referring to FIG. 4D, the first sacrificial layer 226 and the spacer 228 are removed. The first sacrificial layer 226 and the spacer 228 can minimize the etching of the bottom electrode 232 because they have a good etch selectivity with respect to the bottom electrode 232. A second dielectric interlayer 235 is formed on the first dielectric interlayer 220. The second dielectric interlayer 235 exposes the top surface of the bottom electrode 232.

A MTJ structure connected electrically to the bottom electrode 232 is formed on the second dielectric interlayer 235. The bottom electrode 232 may have a smaller horizontal area than the MTJ structure. The bottom electrode 232 can have a width smaller than the width of a pattern capable of being formed through a photolithography process, because it is formed using the spacer 228. The MTJ structure is formed by stacking a free layer 242, a tunnel insulating layer 243, and a pin layer 240 on the bottom electrode 232. The pin layer 240 may include a pinning layer 249 and a pinned layer 245. For example, the pining layer 249 may be formed of platinum-manganese (PtMn).

The pinned layer 245 may be formed of a synthetic anti-ferromagnetic layer including a lower ferromagnetic layer 244, an anti-ferromagnetic coupling spacer 246, and an upper ferromagnetic layer 248. The lower ferromagnetic layer 244 may be formed of cobalt-iron-boron (CoFeB), and the upper ferromagnetic layer 248 may be formed of cobalt-iron (CoFe). The tunnel insulating layer 243 may be formed of magnesium oxide (MgO). The free layer 242 may be formed of cobalt-iron-boron (CoFeB). A conductive capping layer 241 may be formed on the free layer 242 and the bottom electrode 232. The capping layer 241 may be formed of tantalum.

Figure 4E:
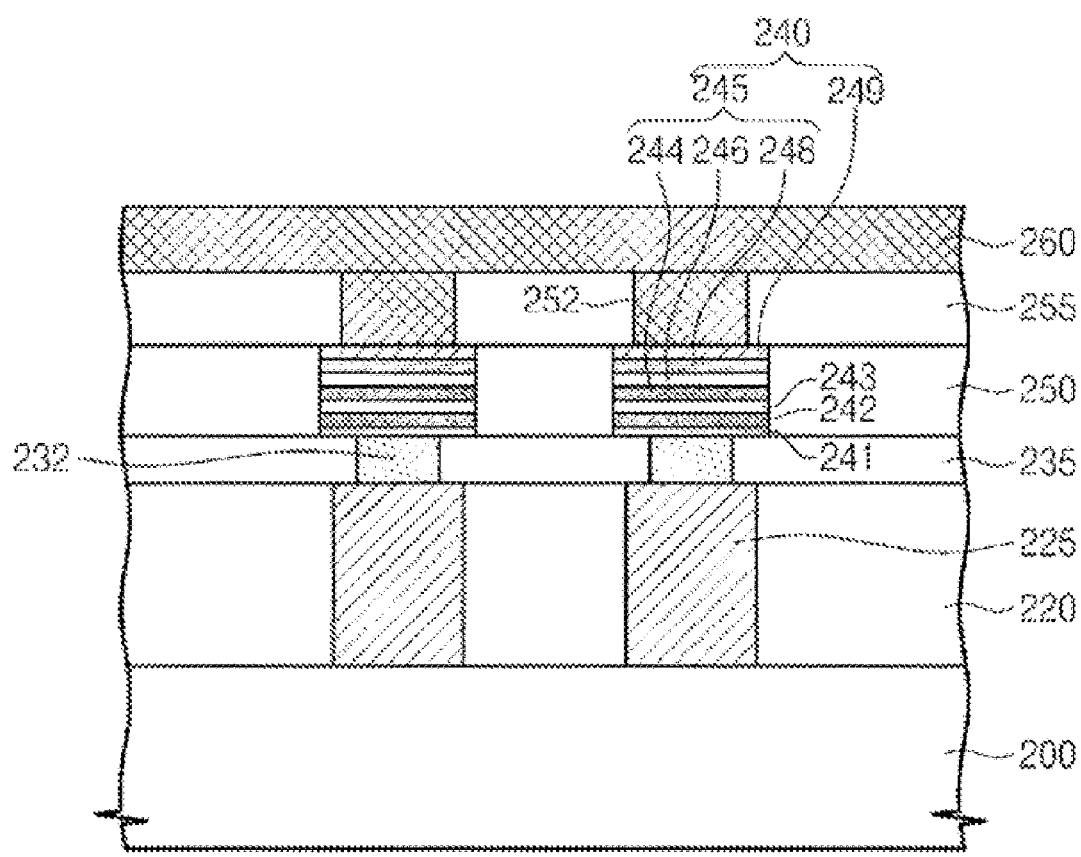

Referring to FIG. 4E, a third dielectric interlayer 250 is formed on the second dielectric interlayer 235 to expose the top surface of the MTJ structure, that is, the top surface of the pinning layer 249. A fourth dielectric interlayer 255 is formed on the third dielectric interlayer 250 to cover the MTJ structure. A top electrode 252 connected electrically to the MTJ structure is formed on the fourth dielectric interlayer 255. A bit line 260 connected electrically to the top electrode 252 is formed on the fourth dielectric interlayer 255.

Figure 5:
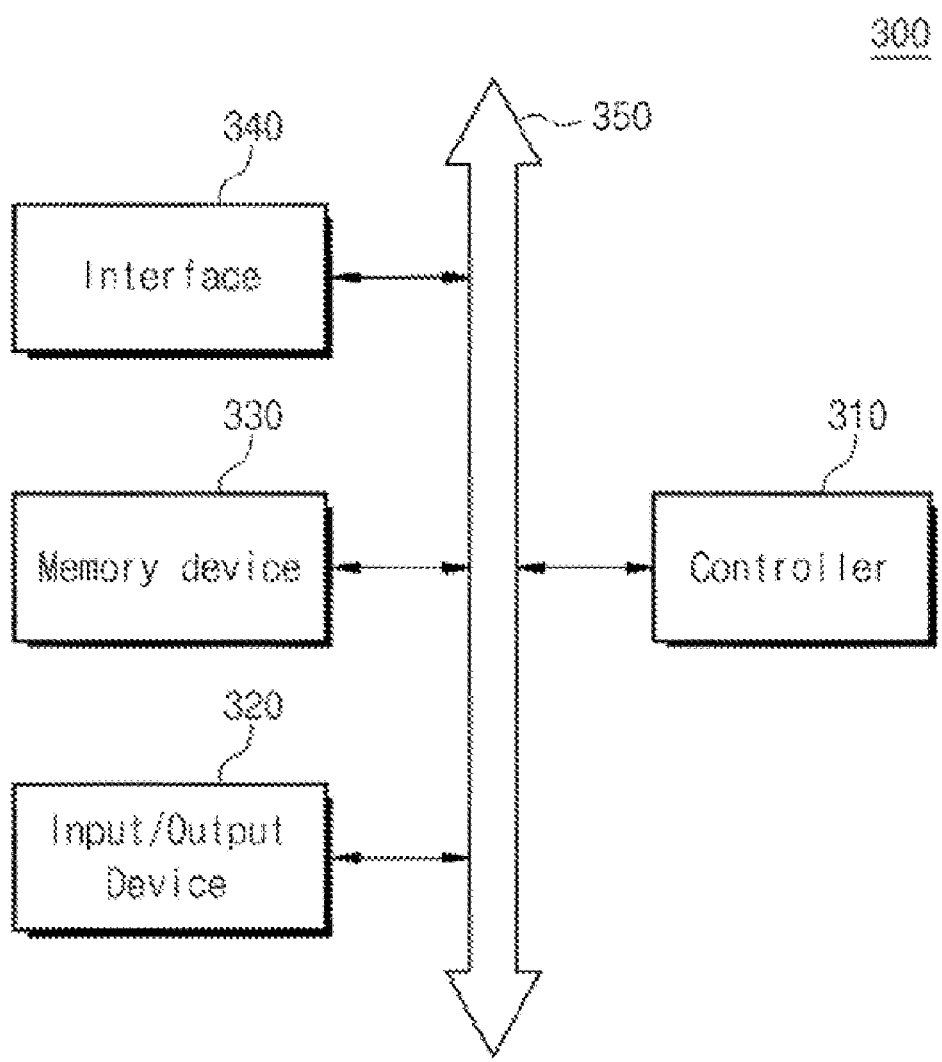
FIG. 5 is a block diagram of an electronic system including a magnetic memory device according to exemplary embodiments of the invention.

FIG. 5 is a block diagram of an electronic system including a magnetic memory device according to exemplary embodiments of the invention.

Referring to FIG. 5, an electronic system 300 may include a controller 310, an input/output device 320, and a memory device 330. The controller 310, the input/output device 320, and the memory device 330 may be coupled through a bus 350. The bus 350 corresponds to a path for transferring data and/or operation signals. The controller 310 may include at least one microprocessor, a digital signal processor, a microcontroller, and at least one of logic devices capable of performing the same functions as the above units. The input/output device 320 may include at least one of a keypad, a keyboard, and a display device. The memory device 330 is used to store data. The memory device 330 may store data and/or commands executed by the controller 310. The memory device 330 may include the magnetic memory device according to an aforesaid embodiment of the invention. The electronic system 300 may further include an interface 340 for transmitting/receiving data to/from a communication network. The interface 340 may be a wired or wireless type. For example, the interface 340 may include an antenna or a wired/wireless transceiver.

The electronic system 300 may be configured to include a mobile system, a personal computer, an industrial computer, or a system performing various functions. Examples of the mobile system include personal digital assistants (PDAs), portable computers, web tablets, mobile phones, wireless phones, laptop computers, memory cards, digital music systems, data transmitting/receiving systems. If the electronic system 300 is wireless communication equipment, it may be used in communication interface protocol for a 3G communication system such as CDMA, GSM, NADC, E-TDMA, WCDMA, and CDMA2000.

Figure 6:
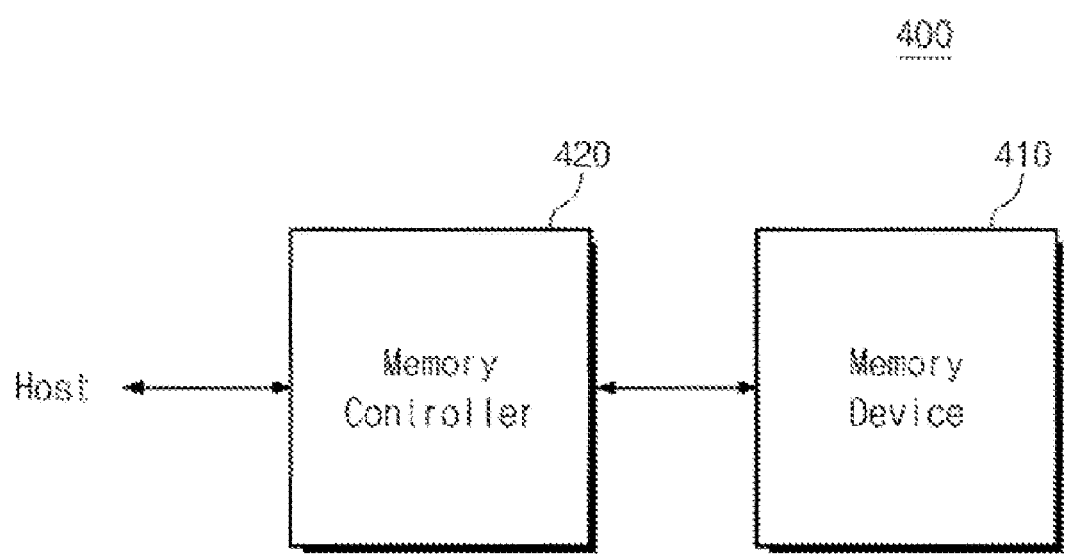
FIG. 6 is a block diagram of a memory card including a magnetic memory device according to exemplary embodiments of the invention.

FIG. 6 is a block diagram of a memory card including a magnetic memory device according to exemplary embodiments of the invention.

Referring to FIG. 6, a memory card 400 includes a memory device 410 and a memory controller 420. The memory device 410 may store data. The memory device 410 may be a non-volatile memory device that can retain stored data even when power supply is interrupted. The memory device 410 may include the magnetic memory device according to an aforesaid embodiment of the invention. The memory controller 420 may read/store data from/in the memory device 410 in response to the read/write request of a host.

As described above, according to an exemplary embodiment of the invention, a magnetic memory device includes an electrode formed of silicon-germanium. The electrode is used to heat a free layer of a MTJ structure, thereby reducing the coercive force of the free layer. That is, the electrode is used as a heating unit, thereby reducing a write current or a critical current. Accordingly, power consumption of a magnetic memory device according to an embodiment can be reduced and the integration density of the device can be increased.

The above-disclosed subject matter is to be considered illustrative and not restrictive, and the appended claims are intended to cover all such modifications, enhancements, and other embodiments, which fall within the true spirit and scope of the invention. Thus, to the maximum extent allowed by law, the scope of the invention is to be determined by the broadest permissible interpretation of the following claims and their equivalents, and shall not be restricted or limited by the foregoing detailed description.

What is claimed is:

1. A magnetic memory device comprising:
  a magnetic tunnel junction (MTJ) structure including a free layer embedded in a multilayered dielectric structure, a pin layer, and a tunnel insulating layer disposed between the pin layer and the free layer;
  a transistor embedded in a semiconductor substrate underlying said multilayered dielectric structure, said transistor adapted to supply a current for switching a magnetization direction of the free layer;
  a silicon-germanium electrode embedded in said multilayered dielectric structure connected to said MTJ structure that is a top electrode connecting said MTJ structure to a bit line, wherein said electrode is adapted to heating said free layer to reduce a coercive force of the free layer; and
  a bottom electrode connecting said MTJ structure to said transistor,
  wherein the top electrode has the same horizontal area as the free layer and has a smaller horizontal area than the pin layer and the tunnel insulating layer.

2. The magnetic memory device of claim 1, wherein the germanium content of the silicon-germanium is about 10% to about 20%.

3. The magnetic memory device of claim 1, further comprising a conductive capping layer between the electrode and the free layer.

4. A magnetic memory device comprising:
  a magnetic tunnel junction (MTJ) structure including a free layer embedded in a multilayered dielectric structure, a pin layer, and a tunnel insulating layer disposed between the pin layer and the free layer;

a transistor embedded in a semiconductor substrate underlying said multilayered dielectric structure, said transistor adapted to supply a current for switching a magnetization direction of the free layer;

a silicon-germanium electrode embedded in said multilayered dielectric structure connected to said MTJ structure that is a bottom electrode connecting said MTJ structure to said transistor, wherein said electrode is adapted to heating said free layer to reduce a coercive force of the free layer; and a top electrode connecting said MTJ structure to a bit line, wherein the bottom electrode has a smaller horizontal area than the free layer.

5. The magnetic memory device of claim 4, wherein the germanium content of the silicon-germanium is about 10% to about 20%.

6. The magnetic memory device of claim 4, further comprising a conductive capping layer between the electrode and the free layer.

* * * * *